(12) United States Patent
Hayashida et al.

(10) Patent No.: US 6,967,536 B2
(45) Date of Patent: Nov. 22, 2005

(54) PHASE-LOCKED LOOP CIRCUIT REDUCING STEADY STATE PHASE ERROR

(75) Inventors: Keiji Hayashida, Kawasaki (JP); Atsushi Hasegawa, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 91 days.

(21) Appl. No.: 10/664,884

(22) Filed: Sep. 22, 2003

(65) Prior Publication Data
US 2004/0061558 A1    Apr. 1, 2004

(30) Foreign Application Priority Data
Sep. 26, 2002  (JP)  .............................. 2002-281842

(51) Int. Cl.$^7$ ................................................ H03L 7/00
(52) U.S. Cl. .................... 331/1 A; 331/57; 331/175; 331/25; 327/156; 327/159; 327/161
(58) Field of Search ................................ 331/1 A, 175, 331/57, 25; 327/156, 159, 161

(56) References Cited

U.S. PATENT DOCUMENTS

| | | |
|---|---|---|
| 5,087,829 A | 2/1992 | Ishibashi et al. |
| 5,670,903 A | 9/1997 | Mizuno |
| 5,883,534 A | 3/1999 | Kondoh et al. |
| 6,346,838 B1 * | 2/2002 | Hwang et al. ............... 327/156 |

FOREIGN PATENT DOCUMENTS

| | | |
|---|---|---|
| EP | 0 299 724 A2 | 1/1989 |
| JP | 2001-111415 A | 4/2001 |

* cited by examiner

*Primary Examiner*—Arnold Kinkead
(74) *Attorney, Agent, or Firm*—Sughrue Mion, PLLC

(57) ABSTRACT

A phase-locked loop circuit has a DLL circuit in a stage preceding an analog PLL circuit. The DLL circuit detects a phase difference between a reference clock signal and a feedback signal, changes the detected phase difference to a phase difference increased so as to be greater than a steady state phase error which the analog PLL circuit has, and supplies the resultant phase difference to the analog PLL circuit. While the phase difference between the reference clock signal and the feedback signal is being detected by the DLL circuit, the analog PLL circuit operates to reduce the increased phase difference to the steady state phase error. As a result, the phase difference between the reference clock signal and the feedback signal is reduced to a sensitivity limit of a phase comparator in the DLL circuit.

19 Claims, 4 Drawing Sheets

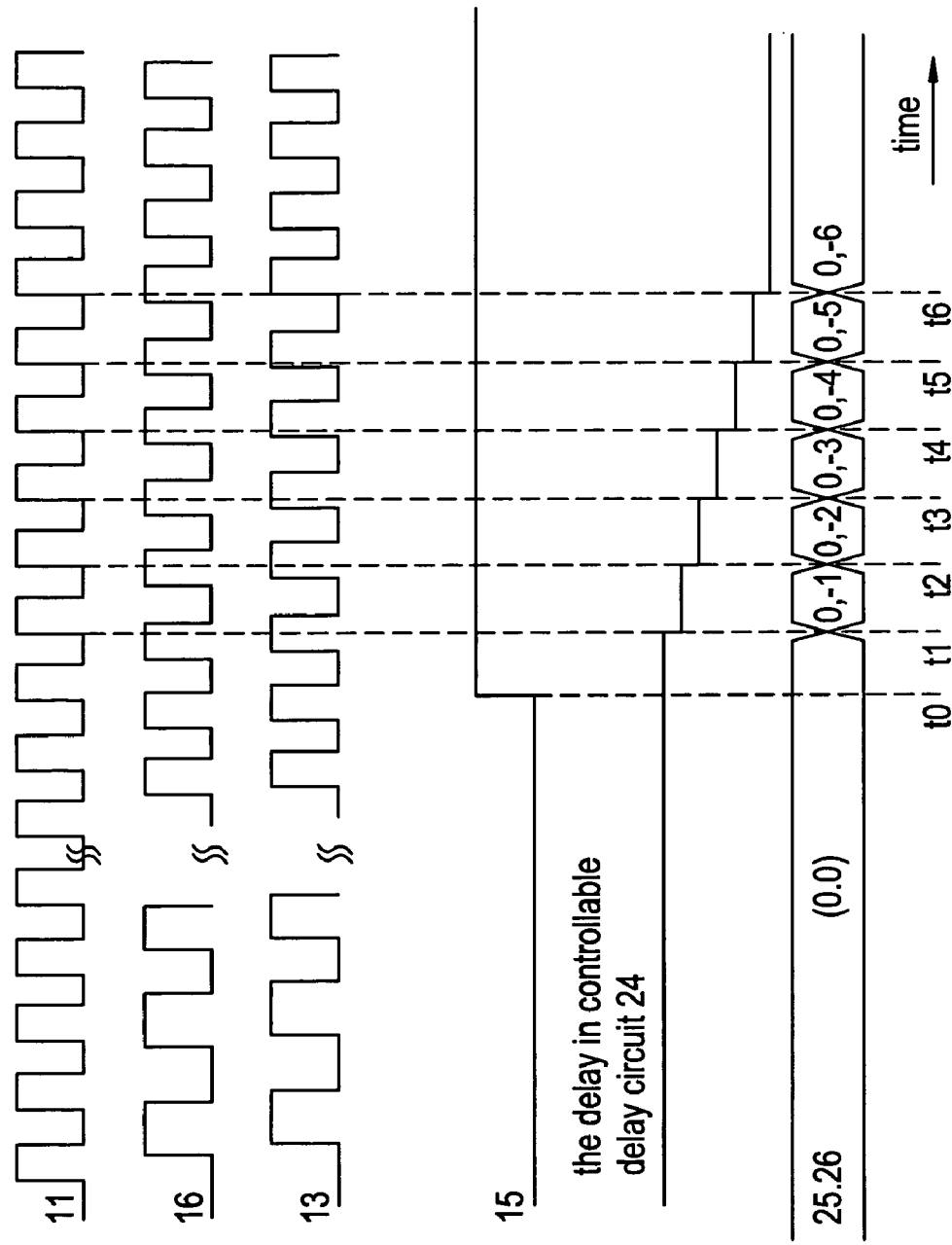

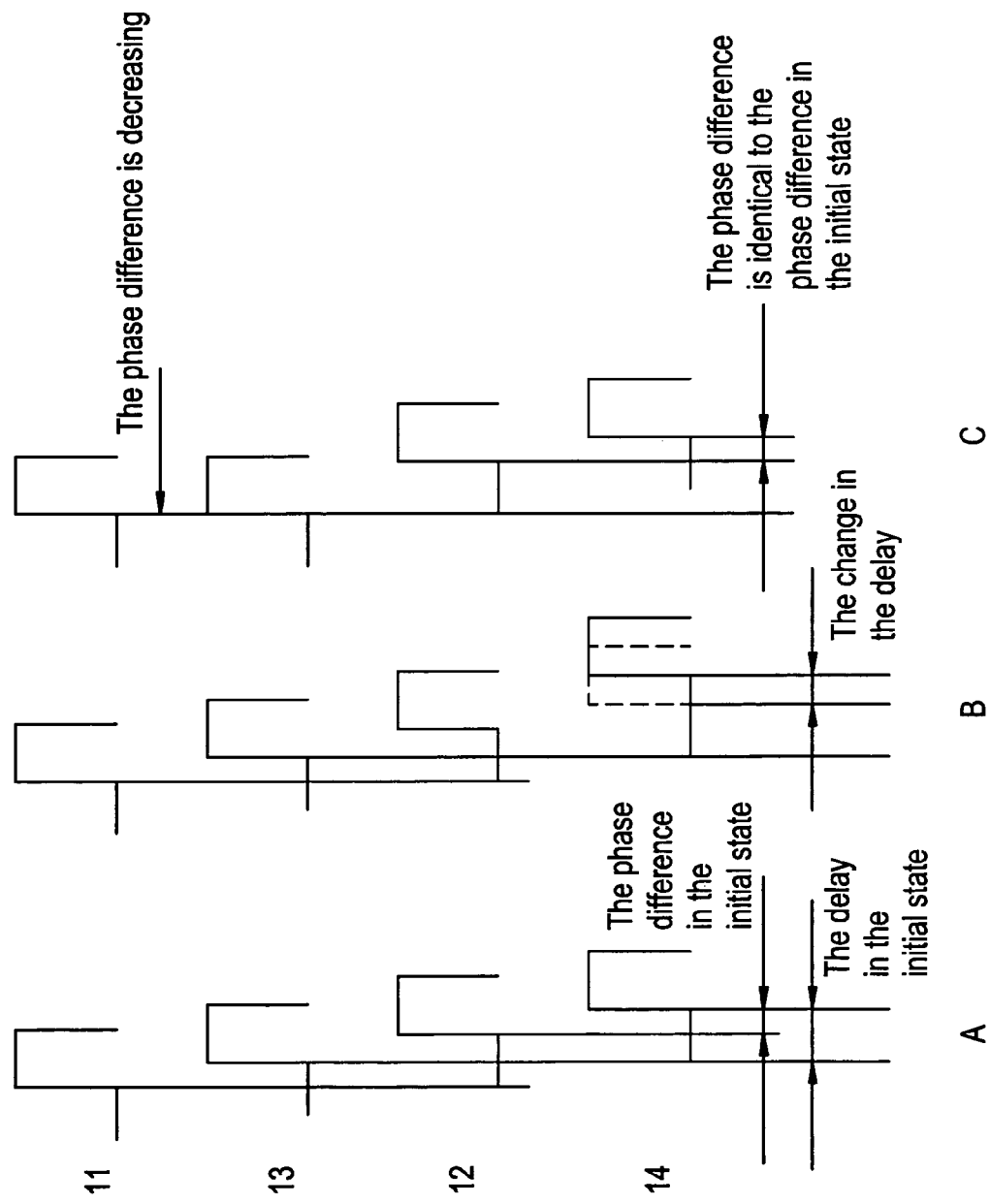

PHASE-LOCKED LOOP CIRCUIT REDUCING STEADY STATE PHASE ERROR

BACKGROUND OF THE INVENTION

1. Field of the Invention

The present invention relates to an analog PLL (Phase-Locked Loop) circuit for use in a semiconductor integrated circuit chip.

2. Description of the Related Art

Semiconductor integrated circuit chips incorporate a PLL circuit for synchronizing a clock signal supplied to various logic circuits in the integrated circuit with a reference clock signal that is supplied from a source external to the integrated circuit.

FIG. 1 of the accompanying drawings shows a block diagram of a conventional PLL circuit in an integrated circuit chip. As shown in FIG. 1, reference clock signal 53 that is supplied from an external source is supplied to an input terminal of analog PLL circuit 52, and a synchronous clock signal supplied to each of logic circuits 57 in an integrated circuit is supplied as feedback signal 54 to another input terminal of analog PLL circuit 52. Analog PLL circuit 52 controls the phase of output clock signal 55 to eliminate any phase difference between reference clock signal 53 and feedback signal 54.

Output clock signal 55 which has been phase-controlled is supplied as a synchronous clock signal to each of logic circuits 57 through CTS (Clock Tree Synthesis) circuit 56 which has elements arranged and wired in a tree configuration for equalizing delay times of output clock signal 55 at the input terminals of logic circuits 57. The phase of output clock signal 55 which is supplied from analog PLL circuit 52 is controlled such that the phase corresponding to the delay time caused by CTS circuit 56 is subtracted from the phase of output clock signal 55 in advance.

Analog PLL circuit 52 comprises, for example, a phase comparator for comparing the phase of feedback signal 54 as a synchronous clock signal supplied from CTS 56 with the phase of reference clock signal 53, a control voltage generator comprising a low-pass filter for generating a control voltage corresponding to the result of comparison carried out by the phase comparator, and a voltage-controlled oscillator (VCO) whose oscillating frequency is controlled by the control voltage. The design of analog PLL circuit 52 is well known to those skilled in the art, and will not be described in detail below. Japanese Patent Laid-Open Publication No. 111415/01 discloses a technology, described in detail below, for increasing the accuracy of phase synchronization of a PLL circuit in a semiconductor integrated circuit, and preventing decrease of the accuracy of phase comparison due to manufacturing variations and interconnection conditions in the integrated circuit. First and second variable delay elements whose delay times can individually be varied are inserted respectively into a first path which extends from a reference clock input terminal of a semiconductor integrated circuit to an input terminal of a phase comparator of a PLL circuit and a second path which serves as a feedback path to another input terminal of the phase comparator for a clock signal that is supplied from the PLL circuit and output to a logic circuit through a CTS circuit. A delay time difference between a third path and a fourth path which are formed equivalently to the first path and the second path, respectively, is measured, and delay times of the first and second variable delay elements are established based on the measured delay time difference between the third path and the fourth path. In this manner, delay times of the first path and the second path are equalized to each other, thus correcting a phase error which would be produced due to a delay time difference between the first path and the second path.

With the above PLL circuit incorporated, it is possible to synchronize a synchronous clock signal (feedback signal 54) supplied to each of logic circuits 57 connected to CTS circuit 56 with reference clock signal 53 from the external source. Furthermore, as disclosed in Japanese Patent Laid-Open Publication No. 111415/01, the accuracy of phase synchronization can be increased by eliminating a phase error based on the difference between the path of the reference clock signal supplied to the phase comparator and the feedback path of the output clock signal. Actually, however, it is very difficult to make the phase difference between the synchronous clock signal (feedback signal) supplied to each of the logic circuits and the reference signal from the external circuit, smaller than a steady state phase error between the reference clock signal supplied to the phase comparator of the analog PLL circuit and the feedback signal due to a relative error or leakage in the circuitry of the analog PLL circuit.

With the arrangement shown in FIG. 1 or disclosed in Japanese Patent Laid-Open Publication No. 111415/01, therefore, the reference clock signal (reference signal 53) applied to the input terminal of the phase comparator and the synchronous clock signal (feedback signal 54) supplied to each of the logic circuits are not precisely in phase, and the PLL circuit becomes stable while these signals are being kept out of phase. There are limitations on attempts to reduce the steady state phase error due to variations and leakage in the analog PLL circuit, making it difficult to synchronize the synchronous clock signal supplied to each of the logic circuits with the reference clock signal perfectly.

If the frequency of the synchronous clock signal is low, then the steady state phase error does not significantly adversely affect the operation of the PLL circuit insofar as the steady state phase error is within a certain allowable range. However, if the frequency of the synchronous clock signal is high, then the allowable range for the steady state phase error is so tight that the steady state phase error cannot be ignored in the operation of the PLL circuit.

FIG. 2 of the accompanying drawings shows a block diagram of a conventional circuit designed for reducing a steady state phase error. The illustrated conventional circuit has a DLL (Delay Locked Loop) circuit placed in a stage following an analog PLL circuit independently thereof. The DLL circuit serves to reduce a steady state phase error which occurs in the analog PLL circuit for thereby synchronizing a synchronous clock signal supplied to each logic circuit with a reference clock signal supplied from an external source.

In FIG. 2, the phase comparator in analog PLL circuit 61 is supplied with reference clock signal 63 from an external source and feedback signal 65 as an output clock signal from the phase comparator, and supplies output clock signal 65, whose phase difference from reference clock signal 63 is reduced to a value within the range of the steady state phase error, to DLL circuit 62.

DLL circuit 62 has a variable delay circuit comprising a plurality of buffers for delaying output clock signal 65 supplied from analog PLL circuit 61 for at least one period, and a delay time control circuit for being supplied with, and detecting a phase difference between, reference clock signal 63 and synchronous clock signal 68 supplied from CTS circuit 66 and controlling a delay caused by the variable delay circuit according to the detected phase difference.

Specifically, the DLL circuit 62 compares the phase of reference clock signal 63 with the phase of synchronous clock signal 68, and controls the delay caused by the variable delay circuit in order to eliminate the phase difference between reference clock signal 63 and synchronous clock signal 68. DLL circuit 62 supplies output clock signal 64 whose delay has been controlled to CTS circuit 66. Therefore, synchronous clock signal 68 supplied from CTS circuit 66 is synchronized with reference clock signal 63, so that logic circuit 67 is supplied with a synchronous clock signal which is synchronized with the reference clock signal.

Generally, analog PLL circuits are less susceptible to the noise of power supply and easier to design than digital PLL circuits. However, there are limitations on attempts to reduce the steady state phase error due to variations and leakage in the analog PLL circuits, making it difficult to synchronize the clock signal supplied to each of the logic circuits with the reference clock signal perfectly.

According to the circuit shown in FIG. 2, the DLL circuit placed in the stage following the analog PLL circuit independently thereof is capable of solving the problem of the steady state phase error that occurs in the analog PLL circuit shown in FIG. 1 or disclosed in Japanese Patent Laid-Open Publication No. 111415/01. However, if the accuracy of the phase of the output clock signal is to be increased, then the scale of the PLL circuit becomes larger, resulting in an increase in the area and power consumption of the integrated circuit which incorporates the PLL circuit therein.

In addition, the DLL circuit which operates independently suffers a problem in that it accumulates noise from the power supply and provides jitter generated in the DLL circuit. The variable delay circuit of the DLL circuit usually comprises a plurality of cascaded buffers, such as CMOS inverters, each having a unit delay. The CMOS inverters have switching times (unit delay times) that are liable to suffer noise of a digital power supply, which is propagated as jitter.

In addition, the DLL circuit shown in FIG. 2 is required for the variable delay circuit to delay the input signal for at least one period. On the other hand, if the accuracy of synchronization of the synchronous clock signal is to be increased, then the unit delay time of each buffer needs to be reduced. Consequently, if the input signal is to be delayed for one period and at the same time the accuracy of synchronization of the synchronous clock signal is to be increased, then the number of cascaded buffers is increased, and the circuit scale is also increased. For example, if the frequency of the clock signal is 300 MHz, then the clock signal has a period of 3.3 nsec. If the buffers have a unit delay time of 10 ps, then in order for the variable delay circuit to delay the input signal for at least one period, at least 330 buffers are required to be connected in cascade.

SUMMARY OF THE INVENTION

It is an object of the present invention to provide a PLL circuit which includes an analog PLL circuit that has a reduced steady state phase error caused by variations and leakage therein while keeping the accuracy of an output signal.

Another object of the present invention is to provide a PLL circuit which reduces jitter due to noise from a power supply and has a smaller circuit scale than it would if an independent DLL circuit were employed.

A phase-locked loop circuit according to the present invention has a DLL circuit in a stage preceding an analog PLL circuit. The DLL circuit detects a phase difference between a reference clock signal and a feedback signal, changes the detected phase difference to an increased phase difference so as to be greater than a steady state phase error due to the analog PLL circuit, and supplies to the output clock signal with the resultant phase difference to the analog PLL circuit. While the phase difference between the reference clock signal and the feedback signal is being detected by the DLL circuit, the analog PLL circuit operates to reduce the increased phase difference to the steady state phase error. As a result, the phase difference between the reference clock signal and the feedback signal is reduced to a sensitivity limit of a phase comparator in the DLL circuit.

According to the present invention, a phase error between the reference clock signal and the feedback signal can be reduced to a value smaller than the steady state phase error due to the analog PLL circuit.

According to the present invention, furthermore, if a delay circuit of the DLL circuit comprises a plurality of cascaded buffers, then the buffers are not required to be as many as one period of the reference clock signal, but the delay circuit may have a delay time corresponding to the steady state phase error of the analog PLL circuit. As a result, the delay circuit may be reduced in scale.

According to the present invention, moreover, even if jitter is generated in the DLL circuit, since the jitter is absorbed by the analog PLL circuit in a subsequent stage, the adverse effect of the jitter is reduced.

The above and other objects, features, and advantages of the present invention will become apparent from the following description with reference to the accompanying drawings which illustrate examples of the present invention.

BRIEF DESCRIPTION OF THE DRAWINGS

FIG. 5 is a timing chart showing the manner in which the PLL circuit according to the embodiment of the present invention operates; and FIG. 6 is a waveform diagram of clock pulses showing the manner in which the PLL circuit according to the embodiment of the present invention operates.

DETAILED DESCRIPTION OF THE PREFERRED EMBODIMENTS

Figure 3:
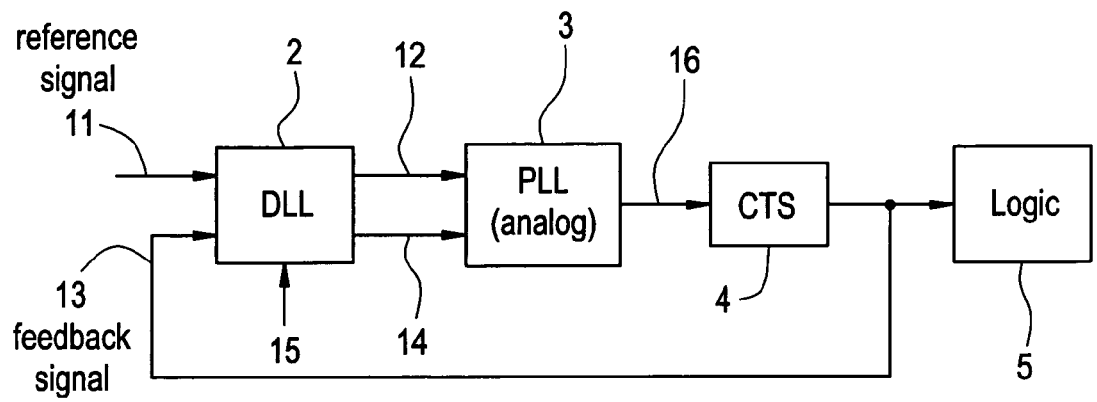
FIG. 3 is a block diagram of a PLL circuit according to an embodiment of the present invention.

FIG. 3 shows a block diagram of a PLL circuit according to an embodiment of the present invention. The PLL circuit according to the embodiment of the present invention is incorporated in an integrated circuit chip.

As shown in FIG. 3, the PLL circuit has internal DLL circuit 2 for comparing the phase of feedback signal 13 as a synchronous clock signal supplied to each of logic circuits 5 in the integrated circuit chip with the phase of reference clock signal 11 supplied from a source external to the integrated circuit chip. If the internal DLL circuit 2 detects a phase difference as a result of the comparison between the phase of feedback signal 13 and the phase of reference clock signal 11, then the internal DLL circuit 2 adds a predetermined phase difference to the detected phase difference to generate reference clock delay signal 12 and feedback delay signal 14, the phase difference therebetween being increased, and supplies reference clock delay signal 12 and feedback delay signal 14 to internal analog PLL circuit 3.

The time at which internal DLL circuit 2 starts to operate is set to a time after internal analog PLL circuit 3 started to operate and a predetermined period of time has passed, or set to a time after internal analog PLL circuit 3 has been locked. Internal DLL circuit 2 is controlled to start its phase difference detecting process when control signal 15 supplied thereto changes from an L level to an H level, for example.

Figure 1:
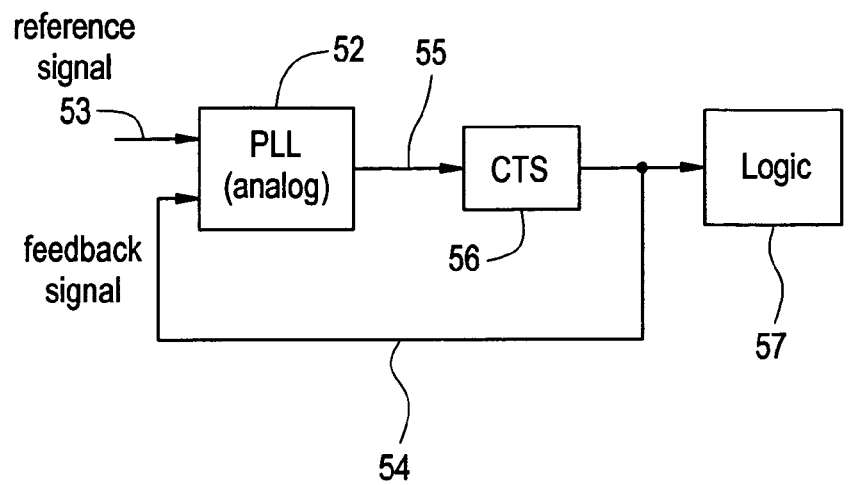
FIG. 1 is a block diagram of a conventional PLL circuit.
Figure 2:
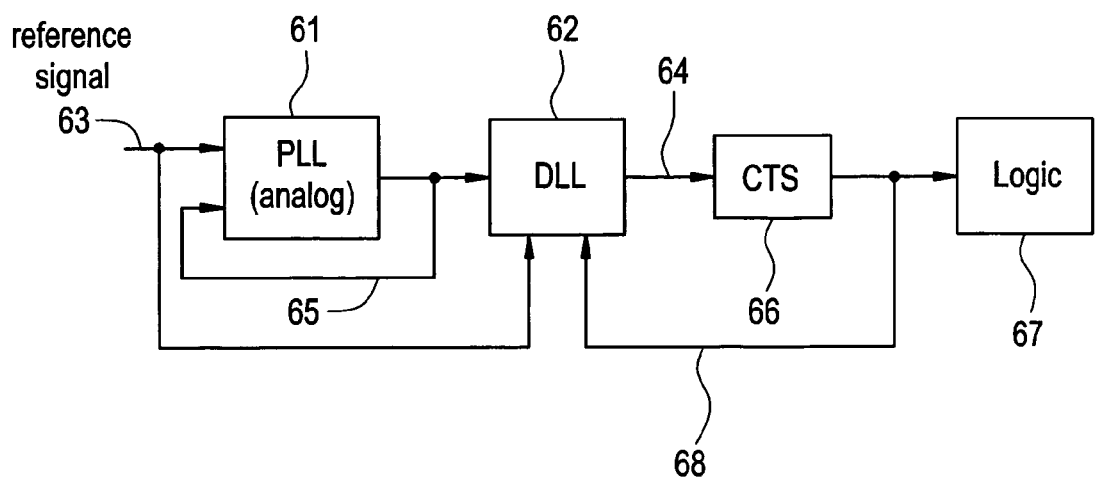
FIG. 2 is a block diagram of another conventional PLL circuit which is designed for reducing a steady state phase error.

Internal analog PLL circuit 3 is supplied with reference clock delay signal 12 and feedback delay signal 14. Internal analog PLL circuit 3 becomes stable when it controls the phase of output clock signal 16 such that the phase difference between reference clock delay signal 12 and feedback delay signal 14 becomes equal to a steady state phase error that internal analog PLL circuit 3 has. Internal analog PLL circuit 3 supplies this phase-controlled output clock signal 16 to CTS circuit 4. Internal analog PLL circuit 3 has the same circuitry as analog PLL circuit 52 as shown in FIG. 1.

CTS circuit 4 equally delays output clock signals 16 supplied from internal analog PLL circuit 3, and supplies delayed output clock signals 16 as a synchronous clock signal to a plurality of logic circuits 5 in the integrated circuit chip. The synchronous clock signal is supplied as feedback signal 13 to an input terminal of internal DLL circuit 2.

Figure 4:
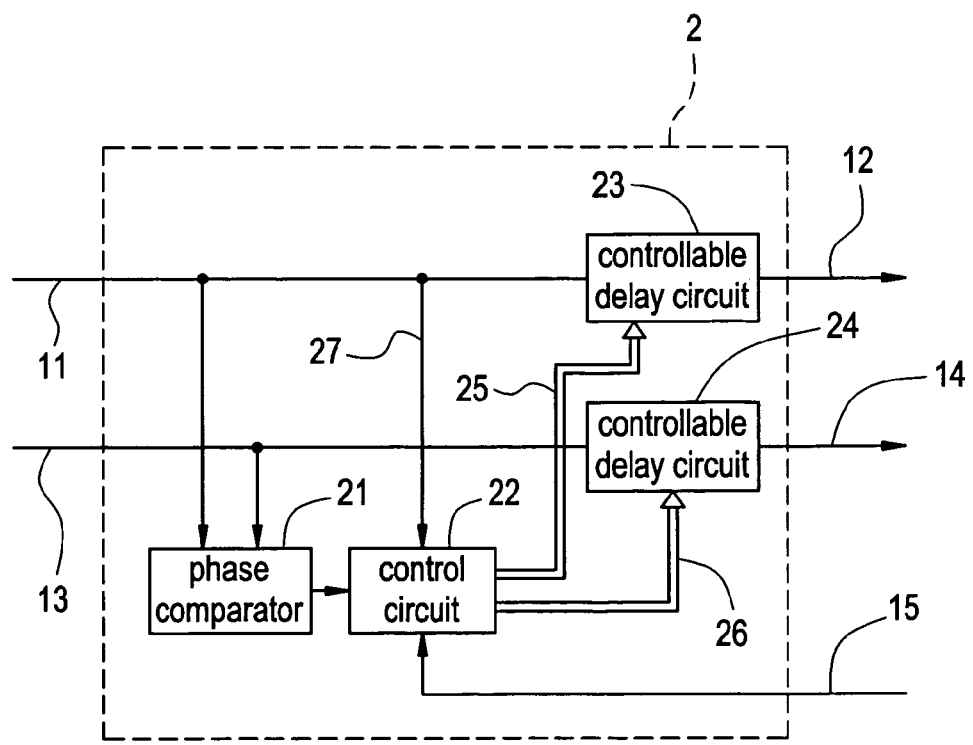
FIG. 4 is a block diagram of an internal DLL circuit in the PLL circuit according to the embodiment of the present invention.

FIG. 4 shows a block diagram of internal DLL circuit 2.

As shown in FIG. 4, internal DLL circuit 2 comprises phase comparator 21 for detecting a phase difference between reference clock signal 11 supplied from the external source and feedback signal 13 as the synchronous clock signal, control circuit 22 for receiving phase difference information from phase comparator 21 and controlling delays caused by controllable delay circuits 23, 24, controllable delay circuit 23 for supplying reference clock signal 11 as reference clock delay signal 12, whose delay time has been controlled by control signal 25 from control circuit 22, and controllable delay circuit 24 for supplying feedback signal 13 as feedback delay signal 14, whose delay time has been controlled by control signal 26 from control circuit 22.

If reference clock signal 11 has a clock frequency of 300 MHz, then analog PLL circuit 3 has a steady state phase error of about ±200 ps. Therefore, controllable delay circuits 23, 24 are designed to have variable delays of about ±100 ps. Specifically, controllable delay circuits 23, 24 may be designed to have respective total delays having a value that is substantially the same as a value (absolute value) expected to be the steady state phase error of analog PLL circuit 3. For example, if each of controllable delay circuits 23, 24 comprises a plurality of cascaded buffers each having a unit delay time of 10 ps, then each of controllable delay circuits 23, 24 can be constructed of a cascaded series of 20 buffers. Therefore, the number of delay buffers of each of controllable delay circuits 23, 24 may be much smaller than the number of buffers in the conventional DLL circuit. Delays caused by controllable delay circuits 23, 24 are controlled by delay control signals 25, 26 each representative of digital bit data.

Controllable delay circuit 23 may comprise a fixed delay circuit, whereas controllable delay circuit 24 may be arranged to have its delay controlled by control circuit 22. Control circuit 22 is supplied with reference clock signal 11 as operating clock signal 27, which governs the control process carried out by control circuit 22.

FIGS. 5 and 6 are a timing chart and a waveform diagram, respectively, showing the manner in which the PLL circuit according to the embodiment of the present invention operates. Operation of the PLL circuit according to the embodiment of the present invention will be described below with reference to FIGS. 3–6.

Internal analog PLL circuit 3 detects a phase difference between reference clock delay signal 12 and feedback delay signal 14. If the phase of feedback delay signal 14 is more delayed than the phase of reference clock delay signal 12, then internal analog PLL circuit 3 advances the phase of output clock signal 16. If the phase of feedback delay signal 14 is more advanced than the phase of reference clock delay signal 12, then internal analog PLL circuit 3 delays the phase of output clock signal 16.

Output clock signal 16 whose phase has been changed by the above control process is sent through CTS circuit 4 back to internal DLL circuit 2 as feedback signal 13. Feedback signal 13 is then processed by internal DLL circuit 2 and supplied as feedback delay signal 14 to internal analog PLL circuit 3. Internal analog PLL circuit 3 again detects a phase difference between reference clock delay signal 12 and feedback delay signal 14, and changes the phase of output clock signal 16 in the same manner as described above. This process is repeated to control the phase of output clock signal 16.

If controllable delay circuits 23, 24 have their delay times set to equal values, then the PLL circuit is brought into a steady state and output clock signal 16 stops changing phase when the phase difference between reference clock signal 11 and feedback signal 13 is zero, and however because of a steady state phase error due to internal analog PLL circuit 3, output clock signal 16 stops changing phase when the phase difference between reference clock signal 11 and feedback signal 13 is not zero, whereupon PLL circuit is brought into a steady state.

To avoid the above drawback, phase comparator 21 of internal DLL circuit 2 detects a phase difference between reference clock signal 11 supplied from the external source and feedback signal 13. If there is a phase difference between those signals, then the delay times of controllable delay circuits 23, 24 are controlled to change a delay time from reference clock signal 11 to reference clock delay signal 12 and a delay time from feedback signal 13 to feedback delay signal 14, giving a larger phase difference between reference clock delay signal 12 and feedback delay signal 14 which are supplied to internal analog PLL circuit 3 than the phase difference between reference clock signal 11 and feedback signal 13. As a result, the phase difference between reference clock signal 11 and feedback signal 13 is controlled so as to become zero.

Operation of the PLL circuit according to the embodiment of the present invention will be described in greater detail below with reference to FIG. 5. FIG. 5 shows an operation mode in which the delay of controllable delay circuit 23 is fixed, only the delay time of controllable delay circuit 24 is variably controlled by control circuit 22, and the delay control process is carried out in each clock period of reference clock signal 11.

<Prior to Time t0>

When control signal 15 is in an L level, control circuit 22 is inactive. At this time, control circuit 22 supplies delay control signals 25, 26 representative of delay data (0, 0) to controllable delay circuits 23, 24 based on preset information. For example, delay data (0, 0) are data for causing tenth buffers of controllable delay circuits 23, 24 to supply their signals as reference clock delay signal 12 and feedback delay signal 14. In an initial state, the delays of controllable delay circuits 23, 24 are set to intermediate values among the available variable delays.

Internal analog PLL circuit 3 supplies output clock signal 16 which is locked with a steady state phase error contained therein in this period. In FIG. 5, reference clock signal 11 and output clock signal 16 are shown as having equal frequencies. However, output clock signal 16 may have its frequency multiplied with respect to the frequency of reference clock signal 11 by inserting a frequency divider in the feedback loop (at a stage preceding feedback signal 13).

<At Time t0>

When control signal 15 goes high in level, control circuit 22 becomes active, starting its control process. Phase comparator 21 detects a phase difference between reference clock signal 11 and feedback signal 13 at this time, and supplies the detected phase difference to control circuit 22. In FIG. 5, the phase of feedback signal 13 is shown as being more advanced than the phase of reference clock signal 11. In response to the detected phase difference, control circuit 22 prepares delay data (0, −1) in order to advance the phase of feedback signal 13 for thereby further increasing the phase difference between reference clock signal 11 and feedback signal 13. "−1" in the data (0, −1) means that the delay is to be reduced from the initial state by a value corresponding to one buffer. The delay may be controlled by a unit of p buffers (p≧2), rather than one buffer.

<At Time t1>

In response to a positive-going edge of reference clock signal 11, control circuit 22 supplies the data (0, −1) as delay control signals 25, 26 respectively to controllable delay circuits 23, 24. In response to delay control signal 26, controllable delay circuit 24 reduces its delay by "−1". Controllable delay circuit 23 does not change its delay. Phase comparator 21 detects a phase difference between reference clock signal 11 and feedback signal 13 and supplies the detected phase difference to control circuit 22 in a period between times t1, t2. Since the phase of feedback signal 13 is still more advanced than the phase of reference clock signal 11 at this time, control circuit 22, responsive to the detected phase difference, prepares delay data (0, −2) in order to further advance the phase of feedback signal 13 for thereby increasing the phase difference between reference clock signal 11 and feedback signal 13. "−2" in the data (0, −2) means that the delay is to be reduced from the initial state by a value corresponding to two buffers.

<From Time t2 to Time t6>

In this period, the control circuit 22 carries out the same control process as described above to reduce the delay of controllable delay circuit 24 until the phase difference between reference clock signal 11 and feedback signal 13 is essentially eliminated. At time t6, the phase difference between reference clock signal 11 and feedback signal 13 is minimized, causing the PLL circuit to become stable. After time t6, each of the logic circuits 5 is supplied with a synchronous clock signal whose phase difference from reference clock signal 11 is essentially reduced to zero, as an operating clock signal.

The delay control process of internal DLL circuit 2 will be described in much greater detail below with reference to FIG. 6. In FIG. 6, the phase of feedback signal 13 is shown as being more delayed than the phase reference clock signal 11.

When internal DLL circuit 2 starts to carry out the delay control process, controllable delay circuits 23, 24 have the same delay. The phase difference between reference clock signal 11 and feedback signal 13 is identical to the phase difference between reference clock delay signal 12 and feedback delay signal 14 (a state indicated at A in FIG. 6).

When the delay control process is started and phase comparator 21 in internal DLL circuit 2 detects that the phase of feedback signal 13 is more delayed than the phase of reference clock signal 11, control circuit 22 supplies data (0, +p) as control signals 25, 26 in order to increase the delay time of controllable delay circuit 24. As a result, the phase difference between reference clock delay signal 12 and feedback delay signal 14 becomes greater than the initial phase difference by the phase corresponding to the delay time (a state indicated at B in FIG. 6).

Since this state is not steady state in internal analog PLL circuit 3, internal analog PLL circuit 3 operates to stabilize the phase-locked loop. Specifically, internal analog PLL circuit 3 operates to advance the phase of output clock signal 16 to equalize the phase difference between reference clock delay signal 12 and feedback delay signal 14 with the phase difference in the state indicated at A in FIG. 6. As a consequence, the phase difference between reference clock signal 11 and feedback signal 13 is reduced.

When the state indicated at C in FIG. 6 is reached, if reference clock signal 11 and feedback signal 13 are determined as being in phase (the phase difference is zero) based on the phase difference information from phase comparator 21 in internal DLL circuit 2, then control circuit 22 keeps the delays of controllable delay circuits 23, 24 at this time. The phase difference between reference clock signal 11 and feedback signal 13 may be minimized either in a single cycle or in a succession of cycles as shown in FIG. 5.

In the above embodiment, the delay time of controllable delay circuit 23 is fixed and only the delay time of controllable delay circuit 24 is variably controlled by control circuit 22. However, the delay time of controllable delay circuit 23 may be variably controlled and the delay time of controllable delay circuit 24 may be fixed, or both the delay times of controllable delay circuits 23, 24 may be variably controlled.

Another delay control process carried out by internal DLL circuit 2 shown in FIG. 4 will be described below.

Phase comparator 21 compares the phase of reference clock signal 11 with the phase of feedback signal 13 to detect which of the phases of these signals is more advanced than the other, and supplies a detected result to control circuit 22. Control circuit 22 accumulates the detected result from phase comparator 21 per each clock pulse or each given number of clock pulses, and controls the delay time depending on the frequency of advance or delay that has been detected.

For example, phase comparator 21 compares the phase of reference clock signal 11 with the phase of feedback signal 13 64 times. If the phase of feedback signal 13 is more advanced than the phase of reference clock signal 11 5 times or less, then control circuit 22 determines that the phase of reference clock signal 11 is more advanced than the phase of feedback signal 13, and increases the delay time of controllable delay circuit 24 (or reduces the delay time of controllable delay circuit 23). If the phase of feedback signal 13 is more advanced than the phase of reference clock signal 11 59 times or more, then control circuit 22 determines that the phase of feedback signal 13 is more advanced than the phase of reference clock signal 11, and reduces the delay time of controllable delay circuit 24 (or increases the delay time of controllable delay circuit 23). If the phase of feedback signal 13 is more advanced than the phase of reference clock signal 11 a number of times between 5 times and 59 times, then control circuit 22 does not change the delay time, but keeps the previous delay control action.

Generally, phase comparator 21 compares the phase of reference clock signal 11 with the phase of feedback signal 13 n times. If the phase of feedback signal 13 is more advanced than the phase of reference clock signal 11 less than m times (m<n/2), then control circuit 22 determines that the phase of reference clock signal 11 is more advanced than the phase of feedback signal 13, and increases the delay time of controllable delay circuit 24 (or reduces the delay time of controllable delay circuit 23). If the phase of reference clock signal 11 is more advanced than the phase of feedback signal 13 less than m times, then control circuit 22 determines that the phase of feedback signal 13 is more advanced than the phase of reference clock signal 11, and reduces the delay time of controllable delay circuit 24 (or increases the delay time of controllable delay circuit 23). If the phase of feedback signal 13 is more advanced than the phase of reference clock signal 11 m times or more or if the phase of reference clock signal 11 is more advanced than the phase of feedback signal 13 m times or more, then control circuit 22 does not change the delay time, but keeps the previous delay control action.

In this manner, even if reference clock signal 11 or feedback signal 13 contains jitter, the delay times are not fluctuated or caused to become unstable by the jitter, and the effect of the jitter on variations of the locked phase is reduced.

While preferred embodiments of the present invention have been described using specific terms, such description is for illustrative purposes only, and it is to be understood that changes and variations may be made without departing from the spirit or scope of the following claims.

What is claimed is:

1. A phase-locked loop circuit comprising:
    a DLL circuit having phase difference detecting unit for detecting a phase difference between a reference clock signal and a synchronous clock signal to be supplied to an electronic circuit which operates in synchronization with said synchronous clock signal,
    and a phase difference changing unit for increasing the phase difference between the reference clock signal and the synchronous clock signal as compared to the detected phase difference, if a phase difference between the reference clock signal and the synchronous clock signal is detected by said phase difference detecting unit,
    wherein said phase difference changing unit outputs a reference clock delay signal and a synchronous clock delay signal having a phase difference equal to the sum of the detected phase difference and a predetermined phase difference; and
    an analog PLL circuit being supplied with said reference clock delay signal and said synchronous clock delay signal from said phase difference changing unit, controlling the phase of an output control signal to synchronize said synchronous clock delay signal with said reference clock delay signal, and supplying the output control signal as said synchronous clock signal to said electronic circuit.

2. A phase-locked loop circuit according to claim 1, wherein said phase difference changing unit sets the sum of said detected phase difference and said added predetermined phase difference to a value greater than a steady state phase error of said analog PLL circuit.

3. A phase-locked loop circuit according to claim 1, wherein said DLL circuit comprises:
    a phase comparator for detecting the phase difference between said reference clock signal and said synchronous clock signal;
    a first delay circuit for delaying said reference clock signal and outputting said reference clock delay signal;
    a second delay circuit for delaying said synchronous clock signal and supplying said synchronous clock delay signal; and
    a control circuit for being supplied with a signal representing the phase difference detected by said phase comparator, and controlling a delay time of at least one of said first delay circuit and said second delay circuit based on said signal representing the phase difference.

4. A phase-locked loop circuit according to claim 3, wherein said first delay circuit and said second delay circuit have respective maximum delay times set to a value which substantially corresponds to a steady state phase error of said analog PLL circuit.

5. A phase-locked loop circuit according to claim 3, wherein said control circuit is supplied with a plurality of detected results from said phase comparator, and if either one of the phases of said reference clock signal and said synchronous clock signal is more delayed than the phase of the other signal less than a predetermined number of times, then said control circuit increases the delay time of the delay circuit for delaying said other signal, and if either one of the phases of said reference clock signal and said synchronous clock signal is more delayed than the phase of the other signal said predetermined number of times or more, then said control circuit does not change the delay times of said first and second delay circuits, but keeps a present delay control action.

6. A phase-locked loop circuit according to claim 1, further comprising:
    a CTS circuit having elements arranged and wired in a tree configuration for equalizing the phase of the output clock signal supplied from said analog PLL circuit and supplying the output clock signal as said synchronous clock signal to an input terminal of said electronic circuit.

7. A semiconductor integrated circuit incorporating therein said phase-locked loop circuit according to claim 1, said semiconductor integrated circuit being supplied with said reference clock signal from an external source.

8. A phase-locked loop circuit comprising:
    an analog PLL circuit for comparing the phase of a first signal with the phase of a second signal and outputting a third signal; and
    a DLL circuit being supplied with a reference signal and said third signal as a feedback signal, comparing the phase of said reference signal with the phase of said feedback signal, and outputting said first signal and said second signal, wherein
    a phase difference between said first signal and said second signal is increased, and
    said phase difference is equal to the sum of the phase difference between the reference signal and said third signal and a predetermined phase difference.

9. A phase-locked loop circuit according to claim 8, wherein said DLL circuit comprises:
    a first delay circuit and a second delay circuit, each comprising a plurality of cascaded unit delay circuits, the arrangement being such that a first unit delay circuit of said first delay circuit receives said reference signal and a predetermined one of the unit delay circuits of said first delay circuit outputs said first signal, and that a first unit delay circuit of said second delay circuit receives said feedback signal and a predetermined one of the unit delay circuits of said second delay circuit outputs said second signal.

10. A phase-locked loop circuit according to claim 9, wherein said first and second delay circuits have respective total delays each set to a value which substantially corresponds to the absolute value of a steady state phase error of said analog PLL circuit.

11. A phase-locked loop circuit according to claim 8, wherein said DLL circuit comprises:
  a first delay circuit comprising a plurality of cascaded unit delay circuits, the arrangement being such that a first unit delay circuit of said first delay circuit receives said reference signal, a predetermined one of the unit delay circuits of said first delay circuit outputs said first signal and outputs said feedback signal as said second signal, and said first delay circuit has a total delay set to a value which substantially corresponds to the absolute value of a steady state phase error of said analog PLL circuit.

12. A phase-locked loop circuit comprising:
  a DLL circuit having phase difference detecting unit for detecting a phase difference between a reference clock signal and a synchronous clock signal to be supplied to an electronic circuit which operates in synchronization with said synchronous clock signal, and a phase difference changing unit for, when a phase difference between the reference clock signal and the synchronous clock signal is detected by said phase difference detecting unit, outputting a reference clock delay signal and a synchronous clock delay signal, with a predetermined phase difference, being added to increase the detected phase difference between the reference clock signal and the synchronous clock signal;
  an analog PLL circuit being supplied with said reference clock delay signal and said synchronous clock delay signal from said phase difference changing unit, controlling the phase of an output control signal to synchronize said synchronous clock delay signal with said reference clock delay signal, and supplying the output control signal as said synchronous clock signal to said electronic circuit; and
  wherein said phase difference changing unit sets the sum of said detected phase difference and said added predetermined phase difference to a value greater than a steady state phase error of said analog PLL circuit.

13. A phase-locked loop circuit comprising:
  a DLL circuit having phase difference detecting unit for detecting a phase difference between a reference clock signal and a synchronous clock signal to be supplied to an electronic circuit which operates in synchronization with said synchronous clock signal, and a phase difference changing unit for, when a phase difference between the reference clock signal and the synchronous clock signal is detected by said phase difference detecting unit, outputting a reference clock delay signal and a synchronous clock delay signal, with a predetermined phase difference, being added to increase the detected phase difference between the reference clock signal and the synchronous clock signal;
  an analog PLL circuit being supplied with said reference clock delay signal and said synchronous clock delay signal from said phase difference changing unit, controlling the phase of an output control signal to synchronize said synchronous clock delay signal with said reference clock delay signal, and supplying the output control signal as said synchronous clock signal to said electronic circuit;
  wherein said DLL circuit comprises:
  a phase comparator for detecting the phase difference between said reference clock signal and said synchronous clock signal;
  a first delay circuit for delaying said reference clock signal and outputting said reference clock delay signal;
  a second delay circuit for delaying said synchronous clock signal and supplying said synchronous clock delay signal, wherein said first delay circuit and said second delay circuit have respective maximum delay times set to a value which substantially corresponds to a steady state phase error of said analog PLL circuit; and
  a control circuit for being supplied with a signal representing the phase difference detected by said phase comparator, and controlling a delay time of at least one of said first delay circuit and said second delay circuit based on said signal representing the phase difference.

14. A phase-locked loop circuit comprising:
  a DLL circuit having phase difference detecting unit for detecting a phase difference between a reference clock signal and a synchronous clock signal to be supplied to an electronic circuit which operates in synchronization with said synchronous clock signal, and a phase difference changing unit for, when a phase difference between the reference clock signal and the synchronous clock signal is detected by said phase difference detecting unit, outputting a reference clock delay signal and a synchronous clock delay signal, with a predetermined phase difference, being added to increase the detected phase difference between the reference clock signal and the synchronous clock signal;
  an analog PLL circuit being supplied with said reference clock delay signal and said synchronous clock delay signal from said phase difference changing unit, controlling the phase of an output control signal to synchronize said synchronous clock delay signal with said reference clock delay signal, and supplying the output control signal as said synchronous clock signal to said electronic circuit;
  wherein said DLL circuit comprises:
  a phase comparator for detecting the phase difference between said reference clock signal and said synchronous clock signal;
  a first delay circuit for delaying said reference clock signal and outputting said reference clock delay signal;
  a second delay circuit for delaying said synchronous clock signal and supplying said synchronous clock delay signal; and
  a control circuit for being supplied with a signal representing the phase difference detected by said phase comparator, and controlling a delay time of at least one of said first delay circuit and said second delay circuit based on said signal representing the phase difference, wherein said control circuit is supplied with a plurality of detected results from said phase comparator, and if either one of the phases of said reference clock signal and said synchronous clock signal is more delayed than the phase of the other signal less than a predetermined number of times, then said control circuit increases the delay time of the delay circuit for delaying said other signal, and if either one of the phases of said reference clock signal and said synchronous clock signal is more delayed than the phase of the other signal said predetermined number of times or more, then said control circuit does not change the delay times of said first and second delay circuits, but keeps a present delay control action.

15. A phase-locked loop circuit comprising:

a DLL circuit having phase difference detecting unit for detecting a phase difference between a reference clock signal and a synchronous clock signal to be supplied to an electronic circuit which operates in synchronization with said synchronous clock signal, and a phase difference changing unit for, when a phase difference between the reference clock signal and the synchronous clock signal is detected by said phase difference detecting unit, outputting a reference clock delay signal and a synchronous clock delay signal, with a predetermined phase difference, being added to increase the detected phase difference between the reference clock signal and the synchronous clock signal;

an analog PLL circuit being supplied with said reference clock delay signal and said synchronous clock delay signal from said phase difference changing unit, controlling the phase of an output control signal to synchronize said synchronous clock delay signal with said reference clock delay signal, and supplying the output control signal as said synchronous clock signal to said electronic circuit; and further comprising:

a CTS circuit having elements arranged and wired in a tree configuration for equalizing the phase of the output clock signal supplied from said analog PLL circuit and supplying the output clock signal as said synchronous clock signal to an input terminal of said electronic circuit.

16. A phase-locked loop circuit comprising:

an analog PLL circuit for comparing the phase of a first signal with the phase of a second signal and outputting a third signal; and a DLL circuit being supplied with a reference signal and said third signal as a feedback signal, comparing the phase of said reference signal with the phase of said feedback signal, and outputting said first signal and said second signal based on a result of comparison between the phase of said reference signal and the phase of said feedback signal, wherein said DLL circuit comprises:

a first delay circuit and a second delay circuit, each comprising a plurality of cascaded unit delay circuits, the arrangement being such that a first unit delay circuit of said first delay circuit receives said reference signal and a predetermined one of the unit delay circuits of said first delay circuit outputs said first signal, and that a first unit delay circuit of said second delay circuit receives said feedback signal and a predetermined one of the unit delay circuits of said second delay circuit outputs said second signal.

17. A phase-locked loop circuit comprising:

an analog PLL circuit for comparing the phase of a first signal with the phase of a second signal and outputting a third signal;

a DLL circuit being supplied with a reference signal and said third signal as a feedback signal, comparing the phase of said reference signal with the phase of said feedback signal, and outputting said first signal and said second signal based on a result of comparison between the phase of said reference signal and the phase of said feedback signal;

wherein said DLL circuit comprises:

a first delay circuit and a second delay circuit, each comprising a plurality of cascaded unit delay circuits, the arrangement being such that a first unit delay circuit of said first delay circuit receives said reference signal and a predetermined one of the unit delay circuits of said first delay circuit outputs said first signal, and that a first unit delay circuit of said second delay circuit receives said feedback signal and a predetermined one of the unit delay circuits of said second delay circuit outputs said second signal; and wherein said first and second delay circuits have respective total delays each set to a value which substantially corresponds to the absolute value of a steady state phase error of said analog PLL circuit.

18. A phase-locked loop circuit comprising:

an analog PLL circuit for comparing the phase of a first signal with the phase of a second signal and outputting a third signal; and a DLL circuit being supplied with a reference signal and said third signal as a feedback signal, comparing the phase of said reference signal with the phase of said feedback signal, and outputting said first signal and said second signal based on a result of comparison between the phase of said reference signal and the phase of said feedback signal, wherein said DLL circuit comprises:

a first delay circuit comprising a plurality of cascaded unit delay circuits, the arrangement being such that a first unit delay circuit of said first delay circuit receives said reference signal, a predetermined one of the unit delay circuits of said first delay circuit outputs said first signal and outputs said feedback signal as said second signal, and said first delay circuit has a total delay set to a value which substantially corresponds to the absolute value of a steady state phase error of said analog PLL circuit.

19. A phase-locked loop circuit according to claim 1, wherein said predetermined phase difference is substantially equal to a steady state phase error of said analog PLL circuit.

* * * * *